(12) United States Patent
Kusunose

(10) Patent No.: US 6,665,326 B2
(45) Date of Patent: Dec. 16, 2003

(54) LIGHT SOURCE DEVICE

(75) Inventor: Haruhiko Kusunose, Yokohama (JP)

(73) Assignee: Lasertec Corporation, Yokohama (JP)

( * ) Notice: Subject to any disclaimer, the term of this patent is extended or adjusted under 35 U.S.C. 154(b) by 0 days.

(21) Appl. No.: 09/976,144

(22) Filed: Oct. 15, 2001

(65) Prior Publication Data

US 2002/0080834 A1 Jun. 27, 2002

(51) Int. Cl.$^7$ .............................................. H01S 3/223
(52) U.S. Cl. ................................................... 372/57
(58) Field of Search .......................... 372/57; 273/371; 250/227.23; 307/88.3; 347/243; 355/61; 359/204

(56) References Cited

U.S. PATENT DOCUMENTS

| | | | | |
|---|---|---|---|---|
| 4,088,898 A | * | 5/1978 | Stitch ........................ | 307/88.3 |
| 4,968,148 A | * | 11/1990 | Chow et al. ................ | 356/427 |
| 5,216,245 A | * | 6/1993 | Keegan et al. ............. | 250/227.23 |
| 5,434,600 A | * | 7/1995 | Schoon ...................... | 347/243 |
| 5,727,789 A | * | 3/1998 | Butts ......................... | 273/371 |
| 5,774,248 A | * | 6/1998 | Komatsu ..................... | 359/204 |
| 6,002,467 A | * | 12/1999 | Nishi et al. ................ | 355/61 |

* cited by examiner

*Primary Examiner*—Paul Ip
*Assistant Examiner*—Tuan Nguyen
(74) *Attorney, Agent, or Firm*—Oliff & Berridge PLC

(57) ABSTRACT

Disclosed is a light source device capable of further enhancing an effective pulse rate. A light source device according to the present invention comprises: a plurality of light sources (1a to 1h) emitting radiation light; a rotating reflection body (2) having one or more reflection surfaces (2a) and emitting the radiation light emitted from the respective light sources (1a to 1h) along an optical path (L) common to the light sources; a position detecting device (5) detecting a position of the reflection surface (2a) of the rotating reflection body (2); a timing control circuit (6) generating a synchronization signal for driving the plurality of light sources in synchronization with the position of the rotating reflection body based on an output signal from the position detecting device; and a power supply circuit (7) sequentially pulse-driving the light sources based on an output signal from the timing control circuit.

9 Claims, 2 Drawing Sheets

LIGHT SOURCE DEVICE

BACKGROUND OF THE INVENTION

1. Field of the Invention

The present invention relates to a light source device, more particularly to a light source device having a high pulse rate and capable of emitting a high-luminance radiation pulse.

2. Description of the Related Art

In an exposure apparatus for use in manufacturing an LSI, far-ultraviolet light has been widely used as exposure light in order to further enhance resolution. As a light source for generating the far-ultraviolet light, a pulse-driven excimer laser has been widely used. Meanwhile, it has become an important subject to enhance a pulse rate of an exposure light source in order to enhance a processing speed during exposure and to improve throughput. Particularly, in an exposure device of a scan system, which uses a pulse light source, it is strongly demanded that the pulse rate of the light source be further enhanced from a viewpoint of improving the throughput. Meanwhile, since the pulse rate of the excimer laser is no more than about 200 Hz, it is strongly demanded that the pulse rate thereof be enhanced. As a method of enhancing a pulse rate, for example, an attempt to enhance a gas flow rate in a tube of the excimer laser has been made.

Moreover, in a microscope or an optical inspection apparatus, since luminance of an illumination light source is sometimes short in the case of executing high-speed observation or high-speed inspection, development of a high-luminance light source as an illumination light source is demanded.

SUMMARY OF THE INVENTION

As a method of enhancing a pulse rate of an excimer laser, a method has been proposed, in which a gas flow rate in a tube is enhanced. However, enhancement of the pulse rate has limitations only by improvement of the gas flow rate, and actually, the pulse rate cannot be enhanced to a desired pulse rate. In addition, when the gas flow rate is wished to be enhanced, a structure of a laser device is made complicated, and a manufacturing cost thereof becomes expensive to a great extent.

Moreover, as a method of enhancing luminance of a light source such as a lamp, conceived is a method of increasing input power. However, even if the input power is increased, actually, only a size of a light emission arc of the light source becomes large, and such an increase does not contribute to the improvement of the luminance very much. Furthermore, conceived is a method of enhancing a light emission rate of the light source. However, though the time-average luminance is enhanced when the light emission rate is enhanced, the time-average input power is limited; therefore, the maximum light emission rate is limited in many cases.

Accordingly, an object of the present invention is to provide a light source device capable of further enhancing an effective pulse rate.

Another object of the present invention is to provide a light source device capable of generating a high-luminance light pulse.

A light source device according to the present invention comprises: a plurality of light sources emitting light; a rotating reflection body having one or more reflection surfaces and emitting the light emitted from each light source along an optical path common to the light source; a position detecting device detecting a position of the reflection surface of the rotating reflection body; a timing control circuit generating a synchronization signal for driving the plurality of light sources in synchronization with the position of the rotating reflection body based on an output signal from the position detecting device; and a power supply circuit sequentially pulse-driving the light sources based on an output signal from the timing control circuit.

A basic concept of the present invention is based on recognition that a plurality of light sources disposed at spatially different positions and emitting light while being displaced with time are synchronized spatially with time, resulting equivalently in that the plurality of light sources exist at spatially the same position. Based on such recognition, in the present invention, used is the rotating reflection body emitting light made incident from various directions along the same optical path in order to spatially synchronize the plurality of light sources disposed at the different positions. Moreover, in order to synchronize the light sources with time, used is the position detecting device detecting positions of the reflection surfaces of the rotating reflection body. And, based on position information from this position detecting device, a synchronization signal synchronized with time is generated. Then, a pulse-shaped drive signal is generated from the power source for driving the light source based on this synchronization signal to sequentially drive each light source. Consequently, a plurality of pulse light sequentially emitted from the plurality of light sources can be sequentially emitted along a common optical path, and the pulse rate is multiplied by a multiple of the number of the provided light sources. Thus, it is made possible to increase the effective pulse rate as a light source device. Simultaneously, accompanied with the increase of the light emission rate of the light source device, the time-average luminance is also increased; consequently, an effective luminance is also increased as a light source device for illumination.

Note that, in this specification, the term "light" includes electromagnetic waves having a variety of wavelength bands such as infrared light, visible light, ultraviolet light and an X-ray. Emission of the ultraviolet light includes electromagnetic radiation of the entire ultraviolet bands of DUV, VUV and EUV. Moreover, the term "light source" means light sources generating the electromagnetic waves having a variety of wavelength bands such as infrared light, visible light, ultraviolet light and an X-ray.

As a light source for use in the present invention, any light source capable of emitting the pulse light can be used, and various light sources such as a xenon flash lamp, an excimer laser and a solid laser such as YAG can be used. Particularly, the xenon flash lamp can generate high-density plasma and emit far-ultraviolet light having a wavelength of about 13 nm; therefore, the xenon flash lamp is extremely suitable as a light source for an exposure apparatus for which a much higher resolution power is required.

Note that, the plurality of light sources may be light sources emitting light entirely having the same wavelength, alternatively may be light sources emitting light having different wavelengths. For example, the plurality of light sources may include light sources emitting the ultraviolet light and light sources emitting the infrared light. In this case, the wavelengths can be selected by switching the synchronization of the rotating reflection body. For example, in response to the purpose of a target to be processed, only the ultraviolet light or the infrared light can be continuously emitted, alternatively, the ultraviolet light and the infrared light can be alternately emitted.

Moreover, as a rotating reflection body, a monogon mirror having one reflection surface or a polygon mirror having a plurality of reflection surfaces can be used. Moreover, as such a reflection surface of the rotating reflection body, a reflection surface having an aluminum layer or a silver layer coated thereon, a reflection surface having a dielectric multi-layered film formed thereon and the like can be used. And, the reflection surface can be properly selected in response to the emission wavelength band to be used. Furthermore, it is also possible to impart wavelength selectivity to the reflection surface of the rotating reflection body, and thus it is also possible to reflect or transmit only radiation light of a specified wavelength band. Hence, it is also possible to emit light of a specified wavelength in one direction and to emit light of another wavelength in another direction by combining the light with the wavelength band of a light source to be used.

A preferred embodiment of the light source device according to the present invention is characterized in that a plurality of light sources are disposed in an approximately equal interval in a circle ring shape on one plane, a rotating reflection body is disposed at a center of the circle ring, and an optical path common to the light sources is set as an axis passing through the center of the circle ring and made perpendicular to the plane. With such a constitution, a small-sized light source device can be realized, which is capable of disposing a large number of light sources adjacent to each other, utilizing the space effectively, and emitting radiation light having a high pulse rate.

Another preferred embodiment of the light source device of the present invention comprises: an excitation light source emitting excitation light; a plurality of target materials converting incident excitation light into radiation light of a wavelength different from the wavelength of the excitation light; a rotating reflection body having one or more reflection surfaces, making the excitation light emitted from the excitation light source incident onto the target materials, and emitting the light emitted from each target material along an optical path common to the target materials; a position detecting device detecting a position of the reflection surface of this rotating reflection body; a timing control circuit generating a synchronization signal for driving the excitation light source in synchronization with the position of each target based on an output signal from the position detecting device; and a power supply circuit pulse-driving the excitation light source based on an output signal from the timing control circuit. This embodiment is suitable for converting the wavelength of the infrared light into the wavelength of the ultraviolet light band such as VUV and EUV and for emitting such ultraviolet band at a high pulse rate. In this case, as an excitation light source, for example, an Nd-added YAG laser or an excimer laser can be used. Moreover, as a target, a variety of wavelength conversion materials such as tin, tantalum and gas jet of xenon can be used. Furthermore, as a reflection surface of the rotating reflection body, for example, in the case of emitting the ultraviolet light of EUV, a dielectric multi-layered film made of molybdenum and silicon can be used. Note that, when the excitation light is incident onto the target and the wavelength conversion is carried out, a scattering molecule such as a high-speed molecule and a molecule cluster is possibly generated. In this case, if the rotating reflection body is constituted of a monogon mirror having one reflection surface, since a drift speed of debris and the like is far slower than that of the light, the scattering molecule such as a high-speed molecule is adhered onto a side or a back of the rotating reflection body other than the reflection surface even if it is generated. Therefore, a possibility of contaminating the reflection surface can be significantly lowered.

DESCRIPTION OF THE PREFERRED EMBODIMENTS

Figure 1A:
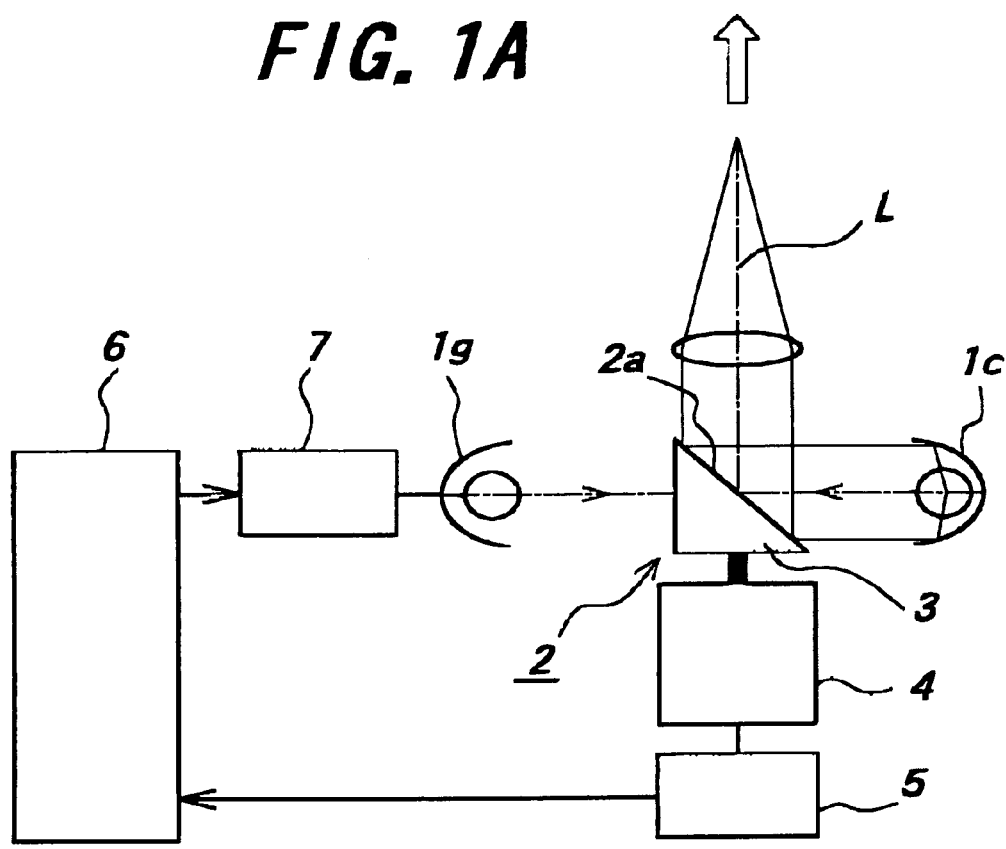
FIGS. 1A and 1B are diagrams showing a constitution of one example of a light source device according to the present invention.
Figure 1B:
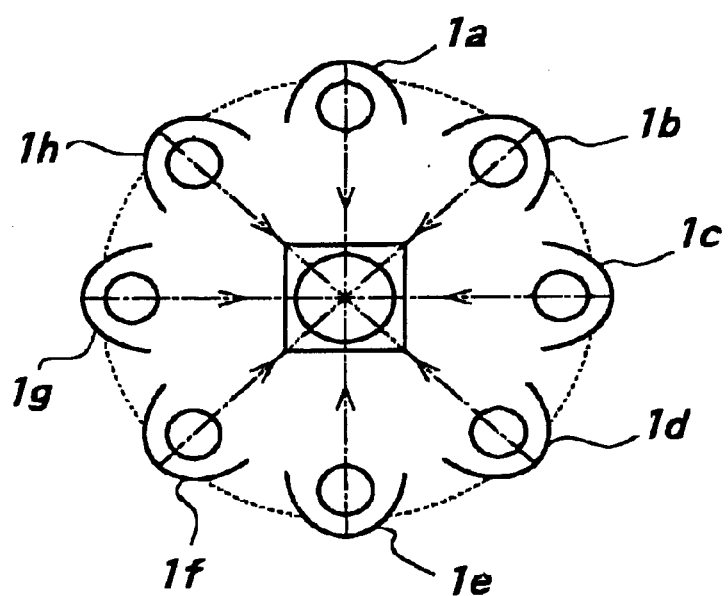

FIGS. 1A and 1B are diagrams showing a constitution of one embodiment of a light source device according to the present invention: FIG. 1A is a diagram showing the entire constitution thereof; and FIG. 1B is a plan diagram showing a disposition constitution of a plurality of light sources and a rotating reflection body. As shown in FIG. 1B, in this embodiment, eight light sources $1a$ to $1h$ are arranged on a circumference at substantially equal intervals in one plane (in FIG. 1A, only two light sources $1c$ and $1g$ are shown), and a rotating reflection body 2 is disposed at a center of this circumference. As such light sources, various light sources can be used in accordance to the application of emitted radiation light. For example, various light sources such as an Nd-added YAG laser, an excimer laser and a xenon lamp can be used.

The radiation light emitted from each of the light sources $1a$ to $1h$ is incident onto a reflection surface $2a$ of the rotating reflection body 2. The rotating reflection body 2 has a right angle prism 3 and a motor 4. The right angle prism 3 is joined to a rotation axis of the motor 4, and rotated at uniform velocity by rotation of the motor 4. The reflection surface $2a$ is formed on a slant surface of the right angle prism 3, which is at a 45° angle relative to an optical path. This reflection surface $2a$ can be constituted of a reflection surface having aluminum or silver coated thereon or of a dielectric multi-layered film. Note that, in the case where the light sources $1a$ to $1h$ emit radiation light having broad spectral regions, for example, such as a xenon lamp, the reflection surface $2a$ is imparted wavelength selectivity to reflect only light having a specified wavelength. Thus, the reflected light can be used as light beams for various kinds of processing.

The radiation light incident onto the rotating reflection body 2 is reflected by the reflection surface, is emitted along an optical path L common to the respective light sources, and used for the various kinds of processing.

To the motor 4, joined is a position detector 5 detecting a rotation position of the rotation axis of the motor 4, that is, an angle position of the reflection surface of the right angle prism 3. As this position detector, for example, an encoder can be used. The position information of the reflection surface $2a$, which is detected by the position detector 5, is supplied to a timing control circuit 6. The timing control circuit 6 generates synchronization signals for driving the eight light sources $1a$ to $1h$ in synchronization with the position of the reflection surface of the rotating reflection body based on the position information concerning the reflection surface $2a$ from the position detector. Specifically, the timing control circuit 6 stores in advance the disposition positions of the respective light sources $1a$ to $1h$ as a coordinate system, and based on displacement amounts of the reflection surface of the rotating reflection body 3 from a coordinate of a reference angle, generates the synchronization signals for sequentially driving a light source corresponding to each displacement amount. For example, in the case of setting an angle position of the light source 1a as a reference, when the position detector 5 detects that the reflection surface 2a has reached a position advancing from the reference angle position by 45°, the reflection surface 2a exists at a position opposite to the light source 1b, and the timing control circuit 6 supplies the synchronization signals to a power supply circuit 7. Then, the power supply circuit 7 supplies pulse-shaped drive signals to the light source 1b to drive the light source 1b. As a result of this, pulse light emitted from the light source 1b is emitted along the optical path L common to the respective light sources. Next, when the position detector 5 detects that the reflection surface has reached a position advancing from the reference angle position by 90°, the power supply circuit 7 supplies the drive signals to the light source 1c to drive the light source 1c based on the synchronization signals from the timing control circuit, and thus pulse light from the light source 1c is emitted along the common optical path L.

For example, in the case of using an excimer laser operating at a frequency of 200 Hz as such a light source, pulses of the ultraviolet light can be generated at a frequency obtained by multiplying the frequency of 200 Hz by 8 by sequentially driving the eight excimer lasers, that is, at a repeated frequency of 1.6 kHz.

Figure 2A:
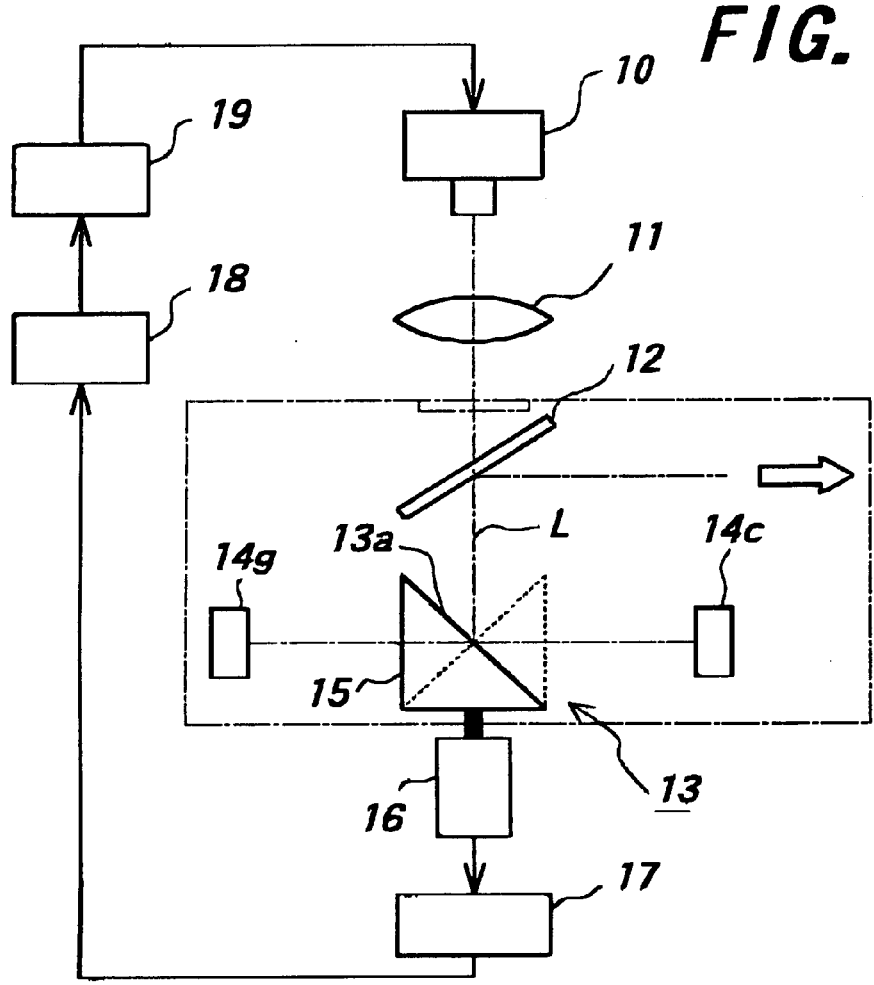
FIGS. 2A and 2B are diagrams showing an embodiment of the light source device according to the present invention, the light source device multiplying a pulse rate and converting a wavelength.
Figure 2B:
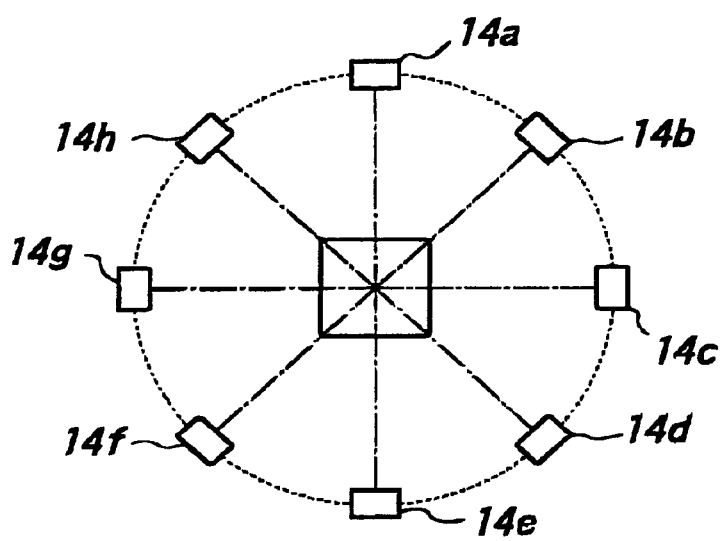

FIGS. 2A and 2B are diagrams showing another embodiment of the light source device according to the present invention. In this embodiment, description will be made for a light source device executing wavelength conversion in addition to the multiplication of the pulse rate. Pulse-shaped excitation light is emitted from an excitation light source 10. In this embodiment, as such an excitation light source, a YAG laser emitting infrared light is used. This excitation light is converged by a lens 11 and transmits through a beam splitter 12. This beam splitter 12 is set as a beam splitter having transmittivity for the infrared light and reflectivity for the ultraviolet light. For example, the beam splitter 12 can be constituted of a dielectric multi-layered film of molybdenum and silicon.

The excitation light transmitted through the beam splitter 12 is made incident onto a rotating reflection body 13 similar to that in the embodiment shown in FIGS. 1A and 1B, reflected on a reflection surface 13a of this rotating reflection body, and made incident as a convergent beam onto a target 14 executing wavelength conversion. As shown in FIG. 2B, eight targets 14a to 14h are disposed in an approximately equal interval in a circle ring shape on the same plane, and the rotating reflection body 13 is disposed at a center of the circle ring. The rotating reflection body 13 is constituted of a monogon mirror having a single reflection surface 13a. This monogon mirror has a right angle prism 15 and a motor 16. The right angle prism is joined to a rotation axis of the motor 16. A position detector 17 is jointed to the motor 16, and detects a position of the reflection surface 13a, and then supplies synchronization signals to a timing control circuit 18 similarly to the embodiment of FIGS. 1A and 1B. The synchronization signals from the timing control circuit are supplied to a power supply circuit 19, and the power supply circuit 19 supplies drive signals to the excitation light source every time when the reflection surface of the rotating reflection body reaches positions opposite to positions of the respective targets 14a to 14h, and allows the excitation light source to emit pulse-shaped excitation light. Note that, in the case of generating ultraviolet light of EUV, an inside portion defined by a dashed line in FIG. 2A must be maintained in a vacuum, and a window must be provided on the optical path in a vacuum chamber to be used.

As a target material, various materials such as tantalum, tin and gas jet of xenon can be used. When the excitation light is made incident onto each target material 14 in a converged state, high-density plasma is generated on a surface of the target material. From this plasma, generated is ultraviolet light or an X ray having, for example, a wavelength band of EUV or VUV of which wavelength is about 13 nm. In the present invention, the ultraviolet light or the X ray subjected to wavelength conversion is utilized as useful radiation light. The radiation light emitted from the target material 14 is made incident onto the reflection surface of the rotating reflection body 13, reflected on the reflection surface, and emitted along the optical path L common to the respective target materials. Then, the light is reflected on the beam splitter 12 disposed between the excitation light source 10 and the rotating reflection body 13, then emitted to the outside. With such a constitution, the target material is sequentially excited, and EUV having the wavelength of about 13 nm can be generated at a high pulse rate, which is extremely useful as a light source device of an exposure apparatus for use in manufacturing an LSI. Moreover, as a useful advantage, inconvenience that the reflection surface is contaminated is eliminated because of the following reason. Specifically, though scattering matter such as debris is generated together with the generation of the high-density plasma due to the incidence of the excitation light, a drift speed of such scattering matter is relatively slow in comparison with the light. Therefore, even if the contaminated matter such as debris is generated, the contaminated matter is adhered onto a side or a back of the monogon mirror other than the reflection surface thereof since the reflection surface 13a is rotatively moved. Moreover, since the target material is cooled for a period after it is excited and before the next target material is excited, there is an advantage in that a sufficient relaxation time can be secured.

The present invention is not limited only to the above-described embodiments, and various modifications and alterations are enabled. For example, the present invention can be applied to the entire light source devices emitting the pulse light, for which the repeated frequency is desired to be increased. The present invention can be applied not only to the exposure apparatus for use in manufacturing an LSI but also to a light source device for processing or inspecting and observing a target by use of radiation light. For example, in a laser processing apparatus defining minute holes in a print circuit board, it is strongly demanded that the repeated frequency of a laser pulse emitted from a laser light source executing pulse oscillation be increased to enhance a processing speed. Accordingly, also in such a technical field, the present invention can be utilized advantageously. Particularly, combination of several excimer lasers having a repeated frequency of about 200 Hz makes it possible to generate an ultraviolet light pulse at a repeated frequency of 1 kHz or higher, which is extremely beneficial for improving the throughput.

What is claimed is:
1. A light source device comprising:
  a plurality of light sources arranged on a circumference at substantially equal intervals;
  a rotating reflection body arranged on the center of the circumference and having a reflection surface for reflecting the light emitted from the respective light sources;
  a driving device for driving the rotating reflection body;

a position detection device for detecting an angular position of the reflection surface of the rotating reflection body;

a timing control circuit for generating synchronization signals for driving the plurality of light sources in synchronization with the position of the reflection surface of the rotating reflection body based on an output signal from the position detecting device; and a power supply circuit for sequentially energizing the light sources based on an output signal from the timing control circuit;

wherein light pulses emitted from the respective light sources are sequentially reflected along an optical axis transversely of a surface including said circumference by way of the reflection surface of the rotating reflection body, the rotating reflection body is arranged on the center of the circumference so as to be enclosed by the plurality of the light sources, and the rotating reflection body comprises a monogon mirror having a single rotating reflection surface.

2. A light source device according to claim 1, wherein the plurality of light sources are excimer lasers which emits light pulses of same wavelength.

3. A light source device according to claim 1, wherein said reflection surface comprises dielectric multi-layer which selectively reflects the light of the specific wavelength.

4. A light source device according to claim 3, wherein said light sources are xenon lamp for emitting radiation pulses of EUV.

5. A light source device comprising:

an excitation light source for emitting excitation light;

a plurality of target materials arranged on a circumference and for converting the incident excitation light to radiation having different wavelength from that of the incident excitation light;

a rotating reflection body being arranged at the center of the circumference so as to be enclosed by the target materials and having a reflection surface for sequentially reflecting the excitation light emitted from the light source toward the respective excitation materials and for sequentially reflecting the radiation reflected by the target materials to emit along a common axis of the light source device, the rotating reflection body comprising a monogon mirror having a single rotating reflection surface;

a driving device for driving the rotating reflection body;

a position detection device for detecting the angular positions of the reflection surface of the rotating reflection body;

a timing control circuit for driving the excitation light source in synchronization with the positions of each target materials based on the output signals from the position detection circuit; and a power supply circuit for energizing the excitation light source based on the output signal from the timing control circuit.

6. A light source device according to claim 5, wherein a beam splitter for separating the radiation emanated from the target materials from the excitation light is arranged between the excitation light source and the rotating reflection body.

7. A light source device according to claim 5, wherein said excitation light source is a YAG laser for emitting infrared radiation pulse.

8. A light source device according to claim 5, wherein said beam splitter comprises a dielectric multi-layered film which transmits the infrared radiation and reflects the ultraviolet radiation.

9. A light source device according to claim 5, wherein said target material is selected from a group including tin, tantalum an gas-jet of xenon to emit radiation pulse of EUV.

* * * * *